United States Patent [19]

Van Erden

[11] Patent Number: 4,921,102

[45] Date of Patent: May 1, 1990

[54] ONE PIECE CARRIER TAPE AND METHOD OF FORMING SAME

[76] Inventor: Donald Van Erden, 23456 Lakeview Ct., Wildwood, Ill. 60030

[21] Appl. No.: 294,201

[22] Filed: Jan. 6, 1989

[51] Int. Cl.⁵ .............................................. B65D 73/00
[52] U.S. Cl. .................................................... 206/470
[58] Field of Search ............... 206/470, 469, 467, 461, 206/486

[56] References Cited

U.S. PATENT DOCUMENTS

| | | | |
|---|---|---|---|
| 2,463,309 | 8/1968 | Szostek | 206/470 |
| 3,420,361 | 1/1969 | Newberg | 206/470 |
| 4,300,682 | 11/1981 | Kuchenbecker | 206/470 |
| 4,496,052 | 1/1985 | Nertman | 206/470 |
| 4,779,734 | 10/1988 | Kydonieus | 206/470 |

Primary Examiner—Joseph Man-Fu Moy
Attorney, Agent, or Firm—Kane, Dalsimer, Sullivan, Kurucz, Levy, Eisele and Richard

[57] ABSTRACT

A one piece integral carrier tape is provided comprising an elongated plastic strip member divided longitudinally by a living hinge into first and second segments so that one segment may be folded over onto the other segment. Component cavities extend along the tape and a plurality of sprocket holes is provided in one of the segments and tabs and tab engaging surfaces are provided on the segments to enable the one segment to be releasably secured to the other segment when the plastic strip is folded along the living hinge. A method of forming the carrier tape is also disclosed.

18 Claims, 3 Drawing Sheets

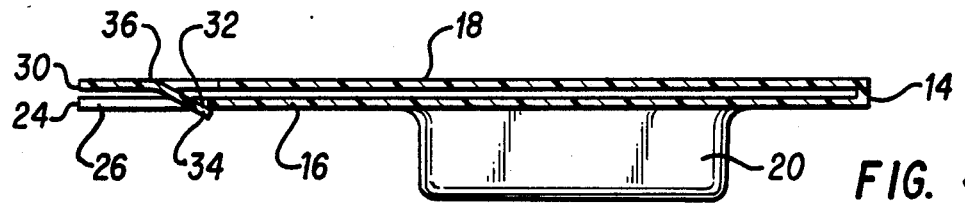
FIG. 4
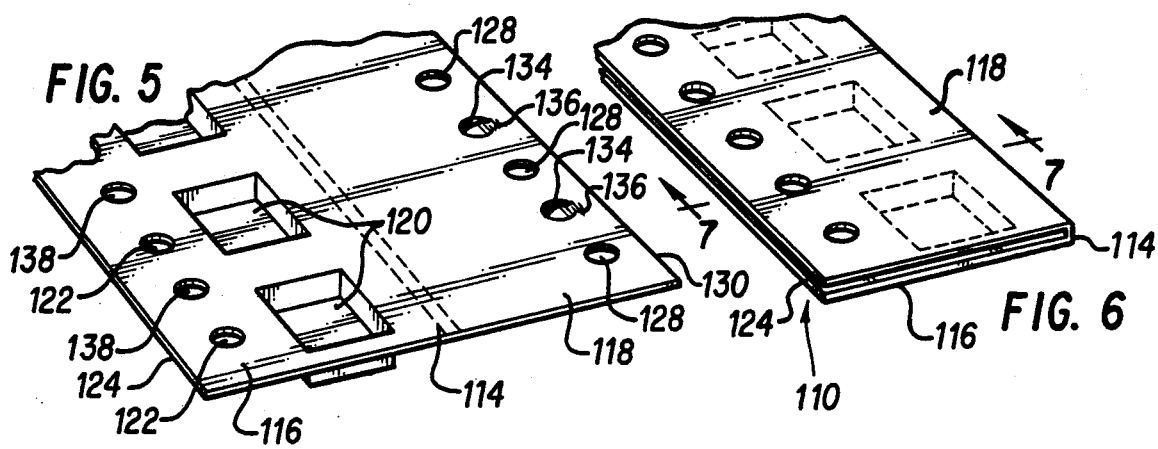
FIG. 5
FIG. 6
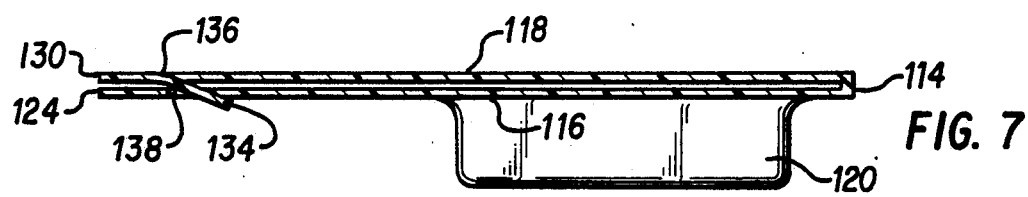
FIG. 7
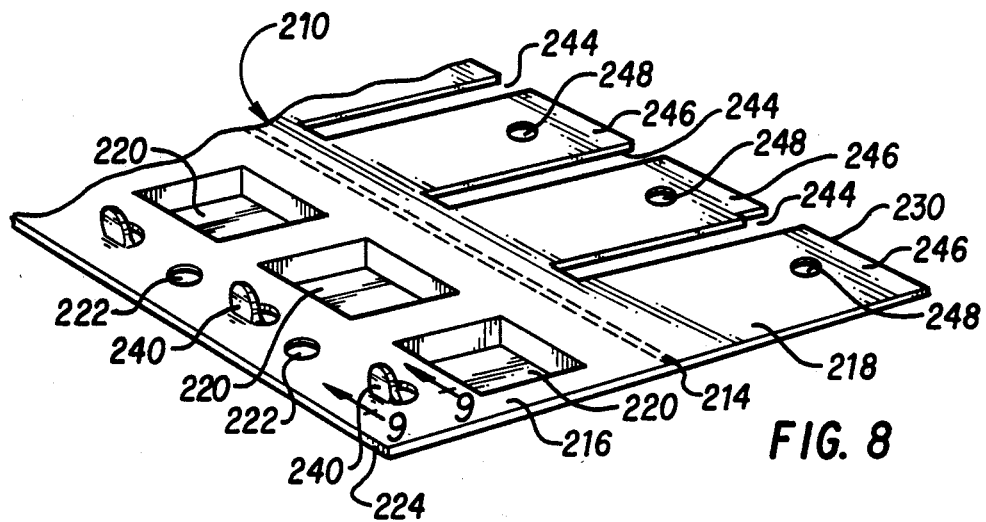
FIG. 8
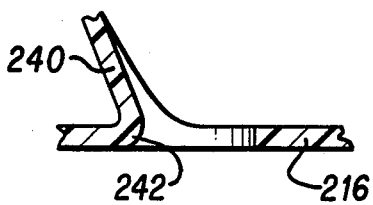
FIG. 9
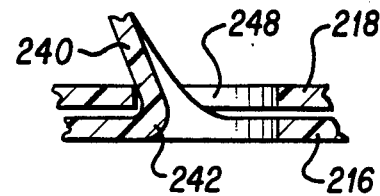
FIG. 10

ONE PIECE CARRIER TAPE AND METHOD OF FORMING SAME

BACKGROUND OF THE INVENTION

The present invention relates to carrier tapes and in particular to a one piece carrier tape in which the base strip and cover strip are integrally formed.

Carrier tapes are of ever increasing importance in assembly operations in numerous industries including, in particular, the electronic and pharmaceutical industries. The tapes are used, for example, to transport miniature and subminiature electronic components from a components manufacturer to a customer's assembly station where automatic equipment functions to remove the component from the carrier tape and mount the component to a circuit board or the like. The carrier tape (or transfer tape, as it is sometimes referred to) may also function to bring different components to an assembly station in proper order to sequential assembly.

Such carrier tapes are often in the form of a base strip of plastic, foil or paper which is usually covered by a cover strip which is sometimes called the top tape. The base strip is formed with a plurality of cavities or pockets for the components and the cover strip is secured to the base strip to thereby prevent the components from prematurely falling out of the cavities. In the past the base strip and cover strip were most commonly held in place by an adhesive, heat bond or spaced snap-type fasteners. Typical examples of prior art carrier tapes are disclosed in U.S. Pat. Nos. 3,465,874; 3,650,430; 3,700,019; 3,894,896; 3,920,410; and 4,298,120. In recently issued patents 4,733,778 and 4,708,245 carrier tapes are disclosed which utilize a continuous mechanical interlock between the base strip and cover strip to obviate many of the problems associated with the use of the various prior art methods of securing the base strip and cover strip.

To function properly, a carrier tape must securely convey its cargo as required and then, at the proper location, be capable of being quickly and positively opened so that the component may be easily removed from assembly purposes. The tape should afford a degree of protection for the sensitive components to be conveyed therein with respect to contamination, electro-static discharge, temperature change and mechanical shock. In addition, the seal or bond between the tape components must be releasable to a known and consistent value at the unloading point to insure that only the required length of base tape will be exposed.

Prior art tapes utilizing heat activated adhesive or heat bonding techniques present a risk of residue contamination. Further, heat bonding requires the use of relatively high temperatures which may be harmful to the components to be carried. In addition, the use of static-dissipative or conductive additives to prevent or dissipate the build-up of electrostatic charge tends to interfere with the bonding characteristics of adhesives.

The above mentioned recently issued patents disclose a carrier tape wherein integrally formed male and female profiles positioned on the base and carrier tapes interlock with each other to provide a construction which avoid the problems discussed above. Such carrier tapes, however, are formed of two components and hence entail two manufacturing and assembly operations which add to the cost of the product.

In view of the above, it is the principal object of the present invention to provide an improved carrier tape construction in which the base and cover strips are integrally formed with each other.

A further object is to provide such a carrier tape which avoids the use of adhesive and chemical bonding and in which the cover strip and base strip may consistently be secured to one another and separated from each other.

Another object is to provide such a carrier tape which may readily be used on existing equipment with little or no modification.

Yet another object is to provide such a carrier tape which may readily be manually opened and closed so as to facilitate the inspection and replacement of the components carried therein.

SUMMARY OF THE INVENTION

The above and other beneficial objects and advantages are attained in accordance with the present invention by providing an elongated plastic strip member divided longitudinally by a living hinge into first and second segments so that one segment may be folded over into the other segment. A line of spaced holes is formed in extending adjacent the free edge of the first segment. A plurality of tabs is formed adjacent the free edge of the second segment. The lines of holes and tabs are substantially equidistant from the living hinge. The holes are equispaced from each other and the tabs are equispaced from each other.

The first segment includes means from engagement with the tabs which, may, for example, include certain ones of the holes. To this end the tabs and holes are aligned with each other. A line of component cavities is formed in one of the segments to carry the components to be conveyed.

The carrier tape of the present invention is formed by extruding an elongated sheet and pressing the sheet within a heated reciprocating press to form a living hinge along the center to divide the sheet into two elongated segments. Pockets or cavities are formed extending along one of the segments. A line of holes is formed along one edge and a line of tabs is formed along the opposite edge. The tabs may be interleaved between holes with the holes in the tab line aligning with holes or cutouts in the hole line. In any event all of the forming may be done in a single pressing operation.

BRIEF DESCRIPTION OF THE DRAWINGS

In the accompanying drawing;

FIG. 4 is a side elevational sectional view taken along reference line 4—4 of FIG. 3;

FIG. 5 is a view similar to FIG. 2 of an alternate construction for a carrier tape in accordance with the present invention;

FIG. 6 is a perspective view of the carrier tape of FIG. 5 in a folded condition;

FIG. 7 is a side elevational sectional view taken along reference lines 7—7 of FIG. 6;

FIG. 8 is a view similar to FIG. 2 of another alternate construction for a carrier tape in accordance with the present invention;

FIG. 9 is a sectional view taken along reference lines 9—9 of FIG. 8;

FIG. 10 is a sectional view of the tab of FIG. 9 in engagement with a mating hole when the carrier tape is in a folded condition;

DETAILED DESCRIPTION OF THE PREFERRED EMBODIMENTS

Improved Carrier Tape

Figure 2:
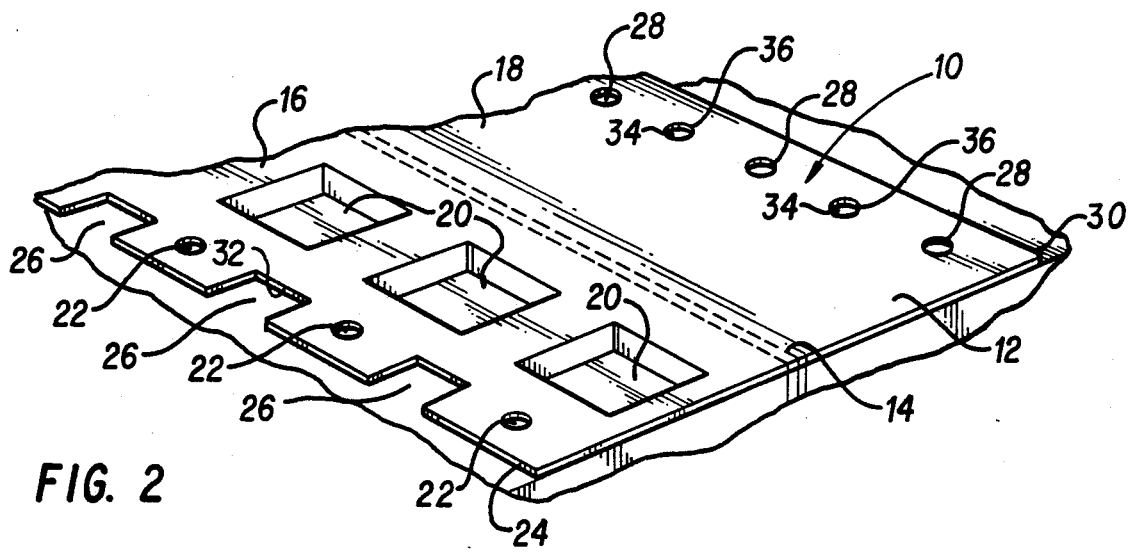
FIG. 2 is a fragmentary view of a carrier tape in accordance with the present invention in an unfolded condition.

Reference is now made to the drawings and to FIG. 2 in particular wherein a first embodiment of a carrier tape 10 is depicted as comprising an elongated plastic strip 12. The carrier tape 10 is preferably formed of suitable plastic film material such as carbon loaded polyvinyl chloride, polypropylene or a glycol based polyester such as polyethylene terephthalate (PETG) which may readily be extruded and formed to the desired shape. The tape should be sufficiently flexible to permit it to be spooled.

Figure 3:
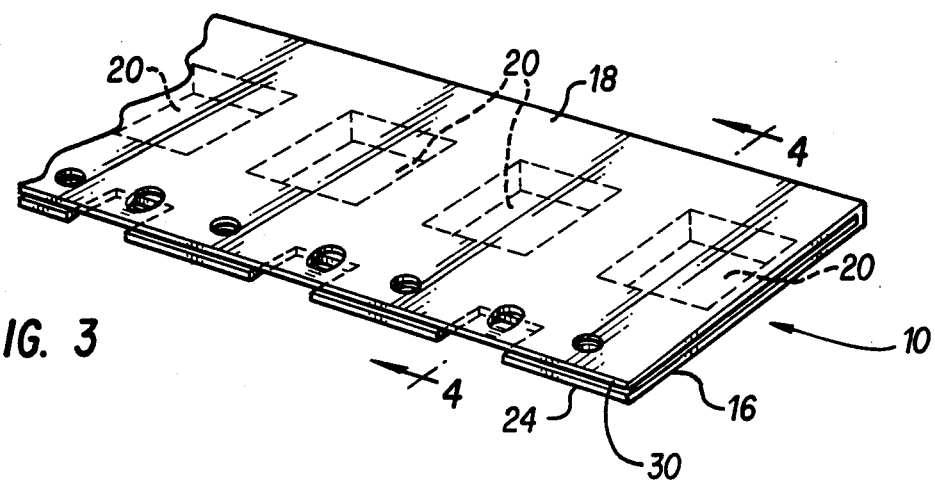
FIG. 3 is a view similar to FIG. 2 with the carrier tape folded and the cover segment locked to the base segment to secure any components in the component cavities.
Figure 11:
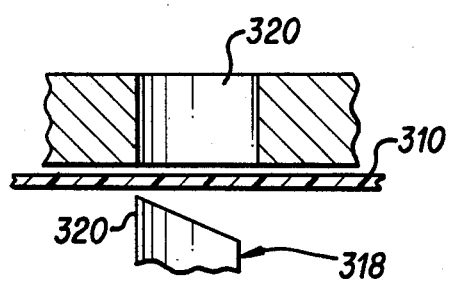
FIGS. 11–14 are fragmentary sectional views depicting the manner of forming the tabs of the carrier tape of the present invention.
Figure 12:
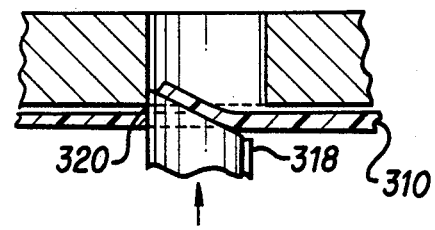
Figure 13:
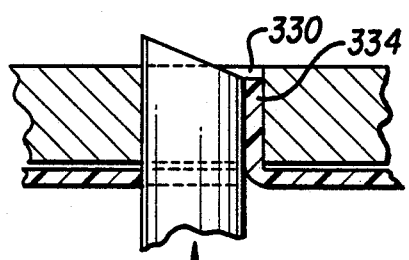
Figure 14:
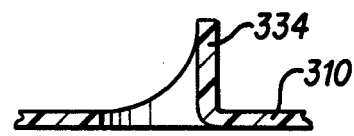

A living hinge 14 extends longitudinally at substantially the center of strip 12 dividing the strip into a first segment 16 and second segment 18. The hinge 14 permits the second segment 18 to be folded over the first segment as shown in FIG. 3 and unfolded repeatedly.

The first segment 16 is formed with a plurality of cavities or component pockets in which the components to be transported on the carrier tape are stored. In this regard, the cavities may be contoured, as required, to maintain the components in a particular orientation, should such orientation be necessary. A longitudinal extending series of aligned sprockets holes 22 is provided extending in a line through the first segment adjacent the free edge 24 thereof. Generally rectangular notches or cutouts 26 are interposed centrally between each adjacent pair of sprocket holes 22. Each of the cutouts 26 extends inwardly from the free edge 24 to a point just beyond the centerline of the line of sprocket holes 22 so that the inward edge 32 of each notch is substantially parallel to free edge 24.

The second segment 18 is also provided with a line of sprocket holes 28 adjacent its free edge 30. The sprocket holes 28 are equally spaced apart from each other by the same distance that the sprocket holes 22 are spaced apart from each other. The second segment sprocket holes 28 are spaced from the living hinge 14 a distance equal to the distance between the living hinge and first segment sprocket holes and the two lines of sprocket holes are aligned so that when the strip is folded (as shown in FIG. 3) each of the sprocket holes 28 overlies one of the sprocket holes 22. Centrally interposed between each of pair of sprocket holes 28 and longitudinally aligned therewith is a tab 34 formed by partially cutting a hole similar to a sprocket hole 28 but with a hinge section 36 left intact.

Referring to FIG. 4 it can be seen that when the second segment 18 is folded over the first segment 16 the sprocket holes 28 and 22 will align and the tabs 34 may be folded under the edges 32 of notches 26 to releasably secure the two segments to one another. In this position components within the cavities 20 may be securely conveyed without danger of the components falling out of the pockets. The tape may be driven by a sprocket engaging the aligned sets of sprocket holes. It should be appreciated that by applying sufficient separating force to the segments the tabs 34 can be forced to override the notch edges to thereby enable the segments to be unfolded and thereby opening to expose to expose the components for removal or further processing.

In FIGS. 5–7 a first alternate embodiment of the carrier tape of the present invention is depicted. The carrier tape 110 is separated by living hinge 114 into segments 116 and 118. Component pockets 120 are formed in segment 116. A line of sprocket holes 122 extends adjacent free edge 124 of segment 116. A line of sprocket holes 122 extends adjacent free edge 124 of segment 116. Interposed between each pair of sprocket holes 122 is a tab engagement hole 138. The centerline of the tab engaging holes 138 coincides with the centerline of the sprocket holes 122 and the diameter of the tab engaging holes is equal to that of the sprocket holes 122. The second segment 118 is provided as previously described with tabs 134 secured by hinges 136 interposed between pairs of sprocket holes 128. As shown in FIG. 7 the tabs 134 engage the holes 138 interposed between each pair of sprocket holes 122 of the first segment while the first and second segment sprocket holes align (as shown in FIG. 6) to permit the tape to be driven by a suitable sprocket drive.

In FIGS. 8–10 a further embodiment of the carrier tape of the present invention is depicted. In this embodiment the carrier tape 210 comprises an elongated plastic strip having a longitudinally extending living hinge 214 separating the strip into a first segment 216 and a second segment 218. A plurality of cavities or component pockets 220 extends along the first segment 216. Sprocket holes 222 are provided in a line adjacent the free edge 224 of segment 216. Interposed between each of the sprocket holes is an upstanding tab 240. As shown in FIGS. 9 and 10 each 240 is hinged at the point 242 which is closest edge 224 and extends toward the edge. Segment 218 is formed with a series of fingers 246 defined by adjacent slots 244 which extent from the free edge 230 of segment 218 toward the living hinge. Each of the slots of segment 218 toward the living hinge. Each of the slots 244 is sufficiently wide to clear the sprocket holes of the first segment 216 when the carrier tape is folded. A tab hole 248 is provided in each of the fingers 246. The tab holes 248 are positioned along a common line which is spaced from the living hinge 214 a distance equal to the distance between the living hinge and the center line of sprocket holes 222. In this manner, when the carrier tape is folded along the living hinge the tab holes 248 each align with and may be engaged by one of the tabs 240 (as shown in FIG. 10) while the sprocket holes 222 are cleared by slots 244 thereby permitting the tape to be driven by a sprocket drive. It should also be noted that each of the fingers 246 forms an individual cover for one of the pockets 220.

Method of Forming Carrier Tape

Figure 1:
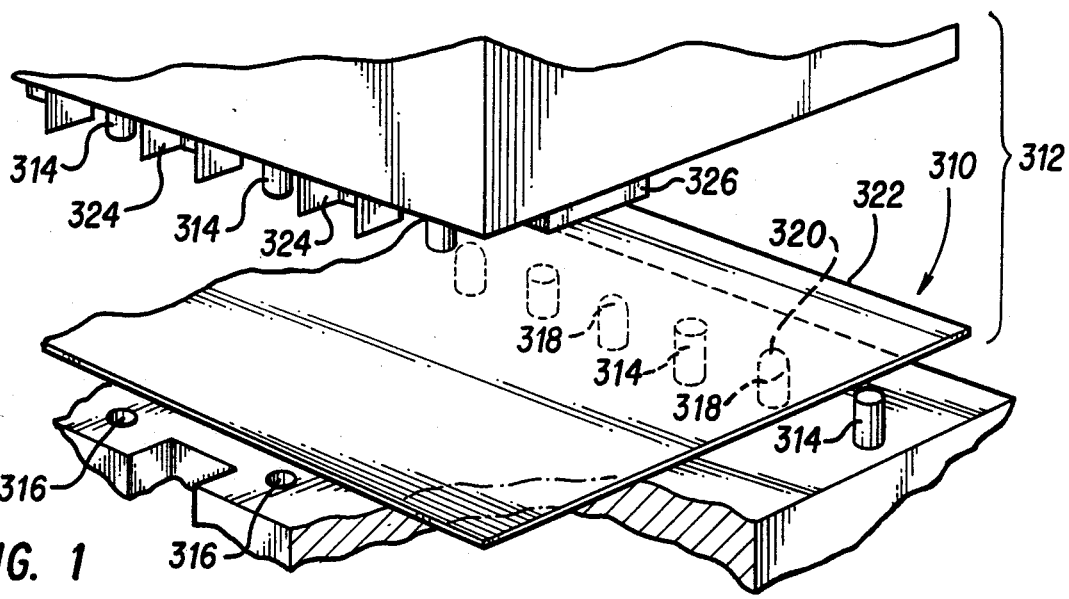
FIG. 1 is a fragmentary, exploded, perspective view of a press for forming a carrier tape in accordance with the present invention.

Reference is now made to FIG. 1 wherein a device for forming the carrier tape of the present invention is depicted. Thus, the carrier tape of the present invention may be formed by extruding an elongated sheet 310 of a suitable plastic material and positioning the sheet within a heat press 312 which includes pins 314 for forming the various sprocket holes. Each of the pins mates against a corresponding recess 316 to remove the material at the location of the hole in a manner somewhat similar to that of the operation of a common paper hole punch. The tabs are formed by pins 318 having tapered forward ends 320 (as shown in FIGS. 11-14). The tapers are offset with the lowest point of the taper corresponding to the desired location of the tab hinge. Further, the mating opening 328 for pin 318 is offset providing clearance 330 for the tab that is formed as the tip of the pin penetrates the plastic material. Thus, it should be noted in FIG. 1 that the lowest point of the taper is closest to the free edge 322 of sheet 310. Referring again to FIGS. 11-14 it can be seen that the blade 318 engages the sheet 310 furthest the desired hinge and the forward edge 320 of the pin penetrates the sheet material 310. As pin 318 extends further into its mating hole 328 the tab 334 is formed and directed into the clearance 330. Appropriate blades 324 are provided for cutting out the cutouts or slots of the carrier tape and heated molds are provided for forming the component cavities.

Figure 15:
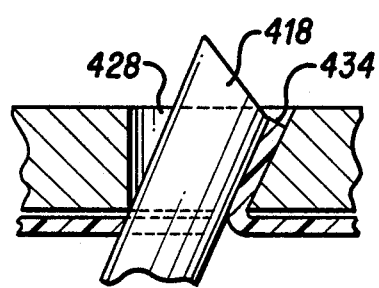
FIG. 15 is a sectional view depicting the method of forming an alternate tab.
Figure 16:
FIG. 16 is a fragmentary sectional view similar to FIG. 9 depicting the tab formed in accordance with FIG. 15.

In FIG. 15 a pin 418 and pin hole 428 configuration are shown for producing a tab 434 on a sheet 410 as shown in FIG. 16. As distinct from the tab 334 of FIG. 14 which extends substantially vertically, the tab 434 extends at an angle away from the hole formed in sheet 410.

Figure 17:
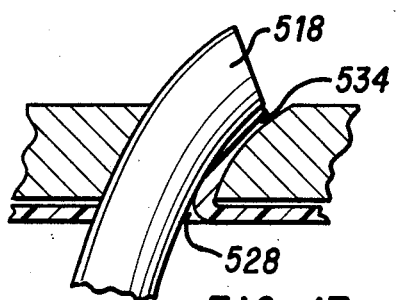
FIG. 17 is a sectional view depicting the method of forming another alternate tab; and, FIG. 18 is a fragmentary sectional view similar to FIG. 9 depicting the tab formed in accordance with FIG. 17.
Figure 18:
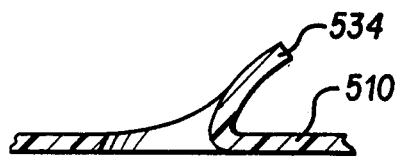

In FIG. 17 a pin 518 and pin hole 528 configuration are shown for producing a curved tab 534 on a sheet 510 as shown in FIG. 18.

Thus in accordance with the above aforementioned objects are effectively attained.

Having the described the invention, what is claimed is:

1. A carrier tape comprising an elongated member formed of a plastic material;
    a living hinge extending longitudinally along said member dividing said member into first and second longitudinal segments extending from said hinge to said member longitudinal edges;
    a plurality of component cavities extending longitudinally along one of said segments;
    a plurality of spaced sprocket holes formed in a line extending adjacent said first segment longitudinal edge; and,
    means for releasably securing said first segment to said second segment when said plastic material is folded along said living hinge.

2. The invention in accordance with claim 1 further comprising a second plurality of spaced sprocket holes formed in a line extending adjacent said second segment longitudinal edge, said first and second segment holes being on lines equidistant from said living hinge.

3. The invention in accordance with claim 2 wherein said securing means includes tab members interleaved between the sprocket holes of one of said lines of sprocket holes and tab engaging members interleaved between the sprocket holes of the other of said lines of sprocket holes.

4. The invention in accordance with claim 3 wherein said tab engaging means are provided on said second segment and comprise cutout sections extending from said second segment longitudinal edge to the centerline of said second segment sprocket holes.

5. The invention in accordance with claim 3 wherein said tab members are centrally positioned between adjacent sprocket holes.

6. The invention in accordance with claim 3 wherein said tab engaging members are centrally positioned between adjacent sprocket holes.

7. The invention in accordance with claim 3 wherein said tab engaging means comprise holes.

8. The invention in accordance with claim 7 wherein said tab engaging holes are centrally positioned between adjacent sprocket holes.

9. The invention in accordance with claim 1 wherein said securing means includes tab members interleaved between said sprocket holes and tab engaging means on said second segment.

10. The invention in accordance with claim 9 wherein said second segment includes a plurality of slots extending from said second segment longitudinal edge toward said living hinge, said slots dividing said second segment into a plurality of fingers with each of said fingers including means for engaging one of said tabs.

11. The invention in accordance with claim 10 wherein said tab engaging means comprise holes.

12. The invention in accordance with claim 10 wherein each of said slots is positioned in line with one of said first segment sprocket holes.

13. The invention in accordance with claim 9 said elongated member is substantially flat and each of said tabs extends substantially perpendicular to said member.

14. The invention in accordance with claim 9 said elongated member is substantially flat and each of said tabs extends from a hinge and is directed away from said living hinge toward said longitudinal edge.

15. The invention in accordance with claim 9 said elongated member is substantially flat and each of said tabs extends from a hinge and is curved away from said living hinge toward said longitudinal edge.

16. A method of forming a carrier tape comprising:
    extruding an elongated strip of plastic material;
    forming a longitudinally extending living hinge in said material dividing said strip into a first segment and a second segment;
    providing a plurality of spaced sprocket holes in aline extending adjacent a longitudinal edge of one of said segments;
    providing a plurality of component cavities in one of said segments; and,
    providing means for releasably securing said first segment to said second segment.

17. The invention in accordance with claim 16 wherein said means for providing securing means includes forming tab members on one of said segments and tab engaging means on the of said segments.

18. The invention in accordance with claim 17 wherein said tab members are formed by piercing said elongated strip with a pin having a tapered point offset toward the living hinge.

* * * * *